United States Patent [19]
Luryi et al.

[11] Patent Number: 5,323,053
[45] Date of Patent: Jun. 21, 1994

[54] SEMICONDUCTOR DEVICES USING EPITAXIAL SILICIDES ON (111) SURFACES ETCHED IN (100) SILICON SUBSTRATES

[75] Inventors: Sergey Luryi, Bridgewater; Gabriel L. Miller, Westfield, both of N.J.

[73] Assignee: AT&T Bell Laboratories, Murray Hill, N.J.

[21] Appl. No.: 89,392

[22] Filed: Jul. 9, 1993

Related U.S. Application Data

[63] Continuation of Ser. No. 891,981, May 28, 1992, abandoned.

[51] Int. Cl.$^5$ ............................................. H01L 29/48
[52] U.S. Cl. ................................... 257/485; 257/486; 257/621; 257/622; 257/627; 257/754
[58] Field of Search ........................... 357/15, 23.6 G; 257/485, 486, 621, 622, 627, 754

[56] References Cited

U.S. PATENT DOCUMENTS 5,040,034 8/1991 Murakami et al. .................... 357/15

OTHER PUBLICATIONS

Mok et al–IEEE Transactions on Electron Devices vol. ED-25, No. 10, Oct. 1978.
M. Gurvitch, et al. "Preparation & Chararacterization of Epitaxial Yttrium Silicide on (111) Silicon", Mat. Res. Soc. Symp. Proc., vol. 91 (1987) pp. 457–465.
K N. Tu, et al. "Low Schottky barrier of rare-earth silicide on n-Si", Appl. Phys. Lett. 38, pp. 626–628 (1981).
H. Norde, et al. "The Schottky-barrier height of the contacts between some rare-earth metals (and silicides) and p-type silicon", Appl. Phys. Lett 38, pp. 865–867 (1981).

Primary Examiner—Edward Wojciechowicz
Attorney, Agent, or Firm—Eileen D. Ferguson; Eugen E. Pacher; Glen E. Books

[57] ABSTRACT

In accordance with the present invention, a silicon device fabricated on a (100) silicon substrate is provided with a (111) slant surface and an electrical contact comprising epitaxial low Schottky barrier silicide is formed on the (111) surface. For example, low resistance rare earth silicide contacts on V-groove surfaces are provided for the source and drain contacts of a field effect transistor. The resulting high quality contact permits downward scaling of the source and drain junction depths. As another example, rare earth silicide Schottky contacts are epitaxially grown on V-groove surfaces to provide low voltage rectifiers having both low power dissipation under forward bias and low reverse-bias leakage current.

8 Claims, 1 Drawing Sheet

5,323,053

SEMICONDUCTOR DEVICES USING EPITAXIAL SILICIDES ON (111) SURFACES ETCHED IN (100) SILICON SUBSTRATES

This application is a continuation of application Ser. No. 07/891,981, filed on May 28, 1992, now abandoned.

FIELD OF THE INVENTION

This invention relates to improved semiconductor devices of the type comprising one or more semiconductor electrical components fabricated on a (100) silicon substrate and having one or more electrical contacts. The improvement is the use of a contact comprising a low Schottky barrier silicide epitaxially formed on a (111) surface obtained by etching of the (100) substrate. The improved contacts permit enhanced performance of devices such as field effect transistors and rectifiers.

BACKGROUND OF THE INVENTION

Much of today's integrated circuit technology involves the fabrication of semiconductor devices on (100) silicon substrates. Complex circuits made up of thousands of transistors, rectifiers, capacitors and resistors can be formed on a tiny area of the substrate to perform a vast variety of complex electronic functions.

Electrical contacts—both ohmic and rectifying—are fundamental to integrated circuits. High quality ohmic contacts are needed to permit further reduction in contact size, and high quality Schottky (rectifying) contacts are needed for low power dissipation rectifiers.

SUMMARY OF THE INVENTION

In accordance with the present invention, a silicon device fabricated on a (100) silicon substrate is provided with a (111) slant surface and an electrical contact comprising epitaxial low Schottky barrier silicide is formed on the (111) surface. For example, low resistance rare earth silicide contacts on V-groove surfaces are provided for the source and drain contacts of a field effect transistor. The resulting high quality contact permits downward scaling of the source and drain junction depths. As another example, epitaxial rare earth silicide Schottky contacts on V-groove surfaces provide low voltage rectifiers having both low power dissipation under forward bias and low reverse-bias leakage current.

BRIEF DESCRIPTION OF THE DRAWING

The nature, advantages and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical representations, are not to scale.

DETAILED DESCRIPTION

Figure 1:
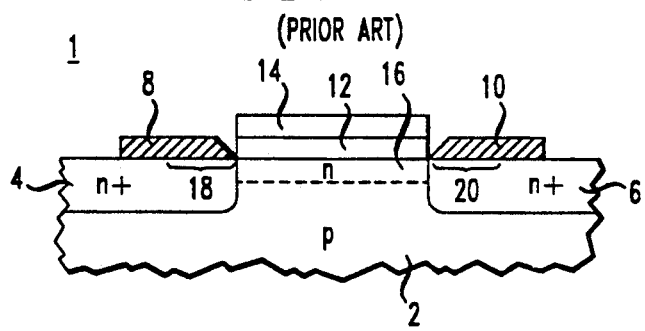
FIG. 1 is a cross sectional view of a typical prior art MOS transistor.

Referring to the drawings, FIG. 1 is a cross section of a typical prior art MOS transistor 1 useful in describing problems to which the present invention is directed. The transistor 1, which is typically fabricated on a (100) silicon substrate 2, comprises a pair of spaced apart heavily doped source and drain regions 4 and 6. Source and drain contacts 8 and 10 overlie regions 4 and 6, respectively, and make ohmic contact thereto. Overlying the region between source and drain regions 4 and 6 is an insulated gate structure comprising insulating layer 12 and overlying gate electrode 14. In operation, when a sufficiently large positive bias is applied to the gate 14, an induced inversion layer channel 16 is formed between the source and drain regions 4 and 6, permitting current flow from source contacts 8 to drain contact 10. The device illustrated is an n-channel device with n+ source and drain. The source and drain contacts 8 and 10 are typically made by silicidization of heavily doped regions 4 and 6.

The quality of the contacts affects the scalability of the device. Since low contact resistance is required for proper device performance, contacts 8 and 10 are constrained in minimum area. In practice, the portion of the metallized areas 18 and 20 immediately adjacent to the inversion layer 16 make the greatest contribution to conductivity. The size of those portions is determined by the thickness of the n+ regions 4 and 6. If the contact resistivity is not sufficiently low, then the effective area must be increased by making the n+ regions deeper. Thus the required conductivity determines how deep the n+ regions 4 and 6 can be and puts a limit on the downward scaling of the device.

Figure 2:
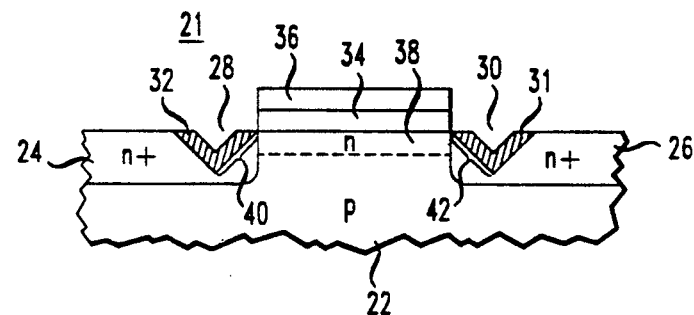
FIG. 2 is a cross section of a MOS transistor having epitaxial rare earth silicide source and drain contacts in accordance with a first embodiment of the invention.

FIG. 2 illustrates a low contact resistivity field effect transistor in accordance with the invention. This transistor 21 comprises silicon substrate 22 with a (100) surface into which two heavily doped regions 24 and 26 are formed. Here the substrate can be p-type silicon and regions 24 and 26 can be n+. V-grooves 28 and 30 are etched in regions 24 and 26 and epitaxial rare earth silicide layers 31 and 32 are formed on the grooves. The slanted V-groove surfaces present (111) crystallographic planes. The width of each V-groove is preferably less than 0.5 μm, and the silicide layers 31 and 32 are preferably 1000 angstroms thick or less. The V-groove areas 28 and 30 act as the source and drain contacts of the transistor 21. The size of the window of the V-groove 28 or 30 determines the depth of the groove. The walls of the groove slope down from the horizontal at a fixed angle of 54.7°. The usual gate structure comprising gate insulator 34 and gate electrode 36 is disposed between contacts 28 and 30. An inversion layer 38 is also formed within the two n+ regions 24 and 26 when sufficient biasing is applied to the gate 36.

The transistor can be fabricated in the conventional manner except that an anisotropic chemical etching process, which is well known in the art, is used to create V-grooves 28 and 30 exposing (111) surfaces. The preferred etching process uses a KOH-alcohol etchant. The etching process stops when the vertex of the V-groove is reached.

The layers of epitaxial silicide 31 and 32 are formed on the (111) silicon surface by known methods as described by M. Gurvitch, et al., "Preparation & Characterization of Epitaxial Yttrium Silicide on (111) Silicon", *Mat. Res. Soc. Symp. Proc.*, Vol. 91, (1987) pp. 457–65. The silicides that can be used are $YSi_2, EuSi, GdSi_2$ or any other epitaxial silicide having a low Schottky barrier height. For a given doping level, the specific resistivity will be lower for a metal that has a lower Schottky barrier height. Thus rare-earth epitaxial silicides have a lower specific contact resistivity. The epitaxial nature of the silicide not only enhances the uniformity of the Schottky barrier but also makes the contact resistance reproducible from device to device.

The combination of the V-groove shape and the epitaxial rare earth silicide 31 and 32 on the (111) surface of the groove both shortens the distance carriers must travel to reach the inversion layer 38 and reduces the resistance. As a result there is a significant decrease in the specific contact resistivity to a level of approximately $10^{-7}$ ohm$\times cm^2$. Additionally, this combination increases the effective area 40 and 42 of the contact 28 and 30 without making the n+ regions 24 and 26 deeper. This reduction in contact resistivity alleviates the contact resistance problem and permits scaling down the size of device 21.

Figure 3:
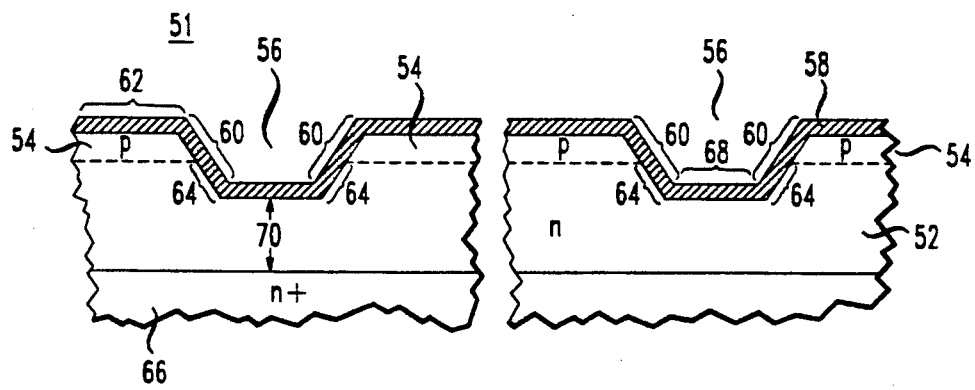
FIG. 3 is a cross section of a rectifier comprising epitaxial rare earth silicide Schottky contacts in accordance with a second embodiment of the invention.

FIG. 3 is a second embodiment of the invention comprising a low voltage drop power rectifier 51. This device comprises a highly doped n+-type silicon (100) substrate 66 upon which is a layer of lightly doped n-type silicon 52 with a layer of p-type silicon 54 on top. The resistivity and the depletion depth 70 of the n-type layer 52 are based on the voltage breakdown of the rectifier. The p-type layer 54 has an abrupt-doping profile with the n-type layer 52 and functions as a guard ring. Truncated V-grooves 56 are etched into the substrate 66, and a layer of epitaxial rare-earth silicide 58 which is a single-crystal having a low Schottky barrier height is formed on the slant (111) V-groove surface 60. Because the silicide 58 is epitaxial in nature, its Schottky barrier is uniform and reproducible. The recommended silicide is yttrium silicide which has a Schottky barrier height on an n-type (111) silicon surface of approximately 0.35 eV. On the (100) surfaces 62 and 68 of the device the silicide 58 neither is epitaxial nor has a low Schottky barrier height. The length of the (100) surface 62 is typically 10 times the length of the (100) surface 68 in the V-groove in order to reduce the power density between rectifiers.

In operation ac power applied between the n+-type layer 66 and the silicide 58 is rectified. Because of the rectification, significant current flows only when the voltage on the silicide metal 58 is positive relative to that on the semiconductor 66 and exceeds approximately 0.3 to 0.4 V. Because the Schottky barrier height on the (100) surfaces is higher, the current flows predominantly in the n-type portion of the slanted V-groove surface 64.

Again an anisotropic chemical etching process is used to create the V-grooves 56. The window width is approximately 2 μm; the V-groove is approximately 1 μm deep, the p-type silicon layer is approximately 1000 angstroms thick and the epitaxial rare earth silicide is approximately 500 angstroms thick.

Figure 4:
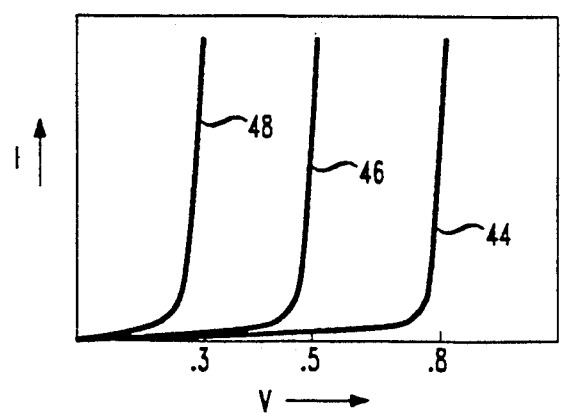
FIG. 4 is a graphical representation showing the enhanced current-voltage characteristics of the FIG. 3 device.

FIG. 4 is a graphical representation showing the current voltage characteristics of several devices, including those of a p-n junction 44, an ordinary Schottky rectifier 46 and an epitaxial rare earth silicide on (111) silicon 48. As can be seen, power dissipated (the product of current and voltage) becomes progressively less when one uses low-barrier rectifiers. A typical silicon p-n junction rectifier 44 turns on when the voltage reaches approximately 0.8 volts. The ordinary Schottky rectifier 46 turns on when the voltage reaches approximately 0.5 volts, and the epitaxial rare-earth silicide rectifier 48 turns on when the voltage reaches only approximately 0.3 volts. The result is a corresponding reduction in power dissipated.

Although the present invention has been described in relation to field effect transistors and low power rectifiers, it is to be understood that it is equally useful for other (100) silicon devices which require contacts. Also, an epitaxial silicide on 111 silicon surface which would make a low Schottky barrier for holes is considered within the context of this invention. Applications and modifications which are apparent to those skilled in the art are included within the spirit and scope of the invention.

We claim:

1. An article comprising a silicon body having a major surface, with one or more semiconductor electrical components fabricated on said major surface, a given of said one or more components comprising
    a) a first and a second n+ doped silicon region, with a planar silicon oxide-covered silicon region extending essentially from said first to said second n+ doped silicon region;
    b) means for making electrical contact to said first and second n+-doped silicon regions; and
    c) means for electrically contacting said silicon oxide; CHARACTERIZED IN THAT
    d) the major surface comprises a (100)-oriented major portion that comprises said planar silicon oxide-covered silicon region and further comprises at least one (111)-oriented minor portion, and at least one of the means of b) comprises a layer of rare earth silicide, at least a portion of said silicide layer being epitaxial with said at least one (111)-oriented minor portion of the surface and being in contact with one of said first and second n+-doped silicon regions.

2. An article according to claim 1, wherein said minor portion comprises a V-groove having (111)-oriented sidewalls, and wherein said epitaxial portion of said layer overlies said side walls.

3. Article according to claim 2, wherein said V-groove has a width of less than 0.5 μm.

4. An article according to claim 1, wherein the silicide is yttrium silicide.

5. An article comprising a silicon body having a major surface, with one or more semiconductor electrical components fabricated on said major surface, a given one of said one or more components being a Schottky barrier diode comprising
    a) a n-doped silicon layer disposed on a n+-doped silicon layer, and a p-doped silicon layer disposed on said n-doped silicon layer;
    b) a recessed feature extending through said p-doped silicon layer into said n-doped silicon layer; and
    c) means for electrically contacting said n-doped silicon layer in said recessed feature; CHARACTERIZED IN THAT
    d) said recessed feature comprises a (111)-oriented surface region, and the means of c) comprise a rare earth silicide layer that is in contact and epitaxial with said (111)-oriented surface region of the recessed feature.

6. An article according to claim 5, wherein said silicide is yttrium silicide.

7. An article according to claim 5, further comprising a p-doped silicon region.

8. An article according to claim 7, wherein said p-doped semiconductor region is also in contact with said silicide layer.

* * * * *